(12) United States Patent
Wang

(10) Patent No.: US 11,222,561 B2
(45) Date of Patent: Jan. 11, 2022

(54) DISPLAY PANEL TEST CIRCUIT

(71) Applicant: WUHAN CHINA STAR OPTOELECTRONICS SEMICONDUCTOR DISPLAY TECHNOLOGY CO., LTD., Hubei (CN)

(72) Inventor: Chaohuan Wang, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 136 days.

(21) Appl. No.: 16/637,807

(22) PCT Filed: Sep. 6, 2019

(86) PCT No.: PCT/CN2019/104614
§ 371 (c)(1),
(2) Date: Feb. 10, 2020

(87) PCT Pub. No.: WO2021/007937
PCT Pub. Date: Jan. 21, 2021

(65) Prior Publication Data
US 2021/0020082 A1    Jan. 21, 2021

(30) Foreign Application Priority Data
Jul. 16, 2019   (CN) .......................... 201910638481.1

(51) Int. Cl.
*G09G 3/00* (2006.01)
*H01L 21/66* (2006.01)
*H01L 27/32* (2006.01)

(52) U.S. Cl.
CPC ............. *G09G 3/006* (2013.01); *H01L 22/32* (2013.01); *H01L 27/3225* (2013.01); *H01L 27/3244* (2013.01)

(58) Field of Classification Search
CPC ..... G09G 3/006; H01L 22/32; H01L 27/3225; H01L 27/3244
See application file for complete search history.

(56) References Cited

U.S. PATENT DOCUMENTS

2006/0149493 A1*  7/2006  Sambandan ......... G09G 3/3233
                                                        702/118
2007/0170948 A1   7/2007  Chang et al.
(Continued)

FOREIGN PATENT DOCUMENTS

CN          101540134 A     9/2009
CN          102768815 A    11/2012
(Continued)

*Primary Examiner* — Marc Anthony Armand
(74) *Attorney, Agent, or Firm* — The Roy Gross Law Firm, LLC; Roy Gross

(57) ABSTRACT

A display panel test circuit that includes a plurality of metal-oxide-semiconductor field-effect transistors (MOSFETs); a first signal line electrically connected to gates of the MOSFETs; a second signal line electrically connected to sources of a part of the MOSFETs; and a third signal line electrically connected to sources of other part of the MOSFETs; wherein sources of any two adjacent MOSFETs of the plurality of MOSFETs are electrically connected to the second signal line and the third signal line, respectively. The display panel test circuit can detect a short circuit problem of a green data signal during a phase of lighting test, and thereby monitor and increase yields of AMOLED display panels.

11 Claims, 4 Drawing Sheets

(56) References Cited

U.S. PATENT DOCUMENTS

| | | | |
|---|---|---|---|
| 2015/0145850 A1* | 5/2015 | Rohatgi | G09G 3/3258 345/212 |
| 2016/0104402 A1 | 4/2016 | Kim | |
| 2017/0061878 A1* | 3/2017 | Park | G09G 3/3233 |
| 2018/0075791 A1 | 3/2018 | Li | |

FOREIGN PATENT DOCUMENTS

| | | |
|---|---|---|
| CN | 105261317 A | 1/2016 |
| CN | 106935167 A | 7/2017 |

* cited by examiner

DISPLAY PANEL TEST CIRCUIT

FIELD OF INVENTION

The present invention relates to the technical field of display, and especially to a display panel test circuit.

BACKGROUND OF INVENTION

In comparison with liquid crystal displays (LCDs), active-matrix organic light-emitting diode (AMOLED) display panels have a unique advantage of self-luminescence. They also have competitive advantages such as lower power consumption, high contrast, wide color gamut, foldability, etc., and have currently become mainstream display panels. However, AMOLED display panels still have a problem of unsatisfactory yields.

FIG. 1 is a schematic diagram of a conventional AMOLED cell phone display panel. In a border area under the panel, from upper to lower, there are a second fanout area 11, a bending area 12, a first fanout area 13, a cell test area 14, and a bonding area 15. On left and right sides of the bonding area 15, there is also a test pad area (as 16 shown in FIG. 2). The test pad area 16 is used for lighting test of the panel, and after passing the test, the panel is through a module process and the AMOLED display panel is finally manufactured.

FIG. 2 is a schematic diagram of wiring in the border area under the conventional AMOLED cell phone display panel. During a phase of lighting test, signals are input by laminating a flexible printed circuit board (FPC) on the test pad area 16 of the panel. Using chip on film (COF) as an example, the test pad area 16 on left and right sides are symmetric and have more than twenty pins respectively. Wherein, there is one dummy pin on left and right sides respectively, and input signals of the other pins can be divided into three categories. Signals of the first category (CK, VGL, VGH, etc.) are directly connected to a gate on array (GOA) area and are used for providing a gate line; the second category (CT_EN and CT_data) are connected to the cell test area 14 and are used for providing data signals; and the third category (VDD and VSS) are used for providing power to the panel. During the phase of lighting test, data signals are provided by the cell test area 14 to the panel, and when reaching the phase of module lighting, data signals are provided to the panel by the FPC and integrated circuit (IC) bonded on the panel.

During the phase of lighting test, when two adjacent data signal lines have a short circuit, the conventional test circuit cannot detect it, because all data signal lines are electrically connected to a same input line and an identical result is displayed on the screen of the lighting test. However, when reaching the phase of module bonding, some abnormalities will appear, and rework is required to repair such abnormalities, thereby increasing complexity of the process and affecting the yields.

SUMMARY OF INVENTION

The present invention provides a display panel test circuit to resolve the technical problem of unsatisfactory yields of AMOLED display panels.

In order to resolve the above-mentioned problem, the present invention provides the following technical approach.

The present invention provides a display panel test circuit that includes a plurality of metal-oxide-semiconductor field-effect transistors (MOSFETs); a first signal line electrically connected to gates of the MOSFETs; a second signal line electrically connected to sources of a part of the MOSFETs; and a third signal line electrically connected to sources of other part of the MOSFETs; wherein sources of any two adjacent MOSFETs of the MOSFETs respectively electrically connected to the second signal line and the third signal line.

According to at least one embodiment of the present invention, the first signal line is a driving signal line, and the second signal line and the third signal line are data signal lines.

According to at least one embodiment of the present invention, the driving signal line is a green driving signal line, and the data signal line is a green data signal line.

According to at least one embodiment of the present invention, when the second signal line is at a low voltage level, the third signal line is at a high voltage level, and when the third signal line is at the low voltage level, the second signal line is at the high voltage level.

According to at least one embodiment of the present invention, the display panel is an active-matrix organic light-emitting diode (AMOLED) display panel.

According to at least one embodiment of the present invention, the MOSFETs are positive channel MOSFETs.

The present invention further provides a test pad pin of a display panel test circuit electrically connected to the display panel test circuit, wherein the test pad pin includes an odd green data signal pin electrically connected to the second signal line.

According to at least one embodiment of the present invention, the test pad pin further includes a dummy pin, wherein the dummy pin is an even green data signal pin electrically connected to the third signal line.

According to at least one embodiment of the present invention, the test pad pin further includes a plurality of direct current signal pins; a plurality of test pins; and an even green data signal pin located between the direct current signal pin and the test pin and electrically connected to the third signal line.

According to at least one embodiment of the present invention, the test pad pin further includes a dummy pin; and an even green data signal pin located on one side of the dummy pin and electrically connected to the third signal line.

The display panel test circuit according to the present invention can detect a short circuit problem of the green data signal during the phase of lighting test, and thereby monitor and increase yields of AMOLED display panels.

DESCRIPTION OF DRAWINGS

In order to further understand features and technical contents of the present invention, please refer to the following detailed description and accompanying drawings of the present invention. However, the accompanying drawings are used for purpose of explanation and do not limit the present invention.

With reference to the following drawings, the technical approach and other beneficial effects of the present invention will be obvious through describing embodiments of the present invention in detail.

The drawings are as the following.

FIG. 1 is a schematic diagram of a conventional active-matrix organic light-emitting diode (AMOLED) cell phone display panel.

FIG. 2 is a schematic diagram of wiring in a border area under a conventional AMOLED cell phone display panel.

FIG. 3 is a schematic diagram of a circuit design of a display panel test circuit according to the present invention.

FIG. 4 is a schematic diagram of a green data signal driving part in a display panel test circuit according to the present invention.

Figure 5:
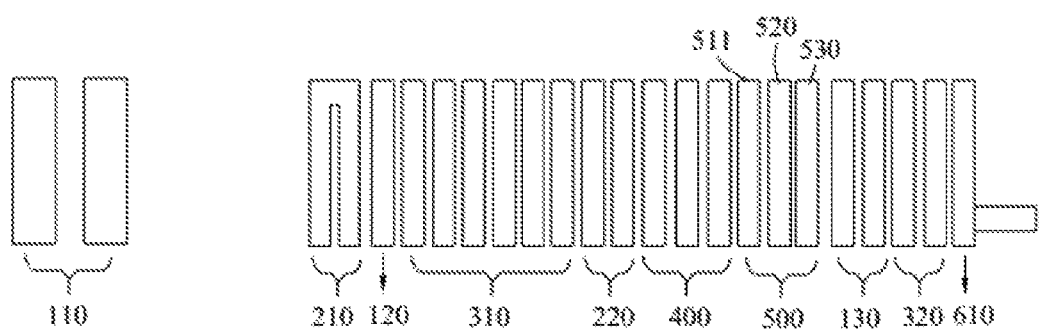

FIG. 5 a schematic diagram of a test pad pin of a display panel test circuit according to an embodiment of the present invention.

Figure 6:
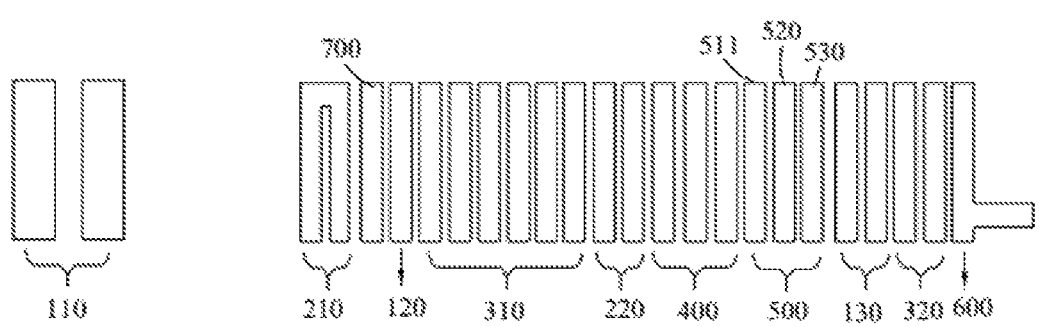

FIG. 6 a schematic diagram of a test pad pin of a display panel test circuit according to another embodiment of the present invention.

DETAILED DESCRIPTION OF PREFERRED EMBODIMENTS

In order to further describe the technical approach and the effects of the present invention, the following describes in detail with reference to advantageous embodiments and the accompanying drawings of the present invention.

The present invention directs to the technical problem that a conventional test circuit, during the phase of lighting test, cannot detect a short circuit of two adjacent data signal lines, and the present embodiment can resolve this drawback.

Figure 1:
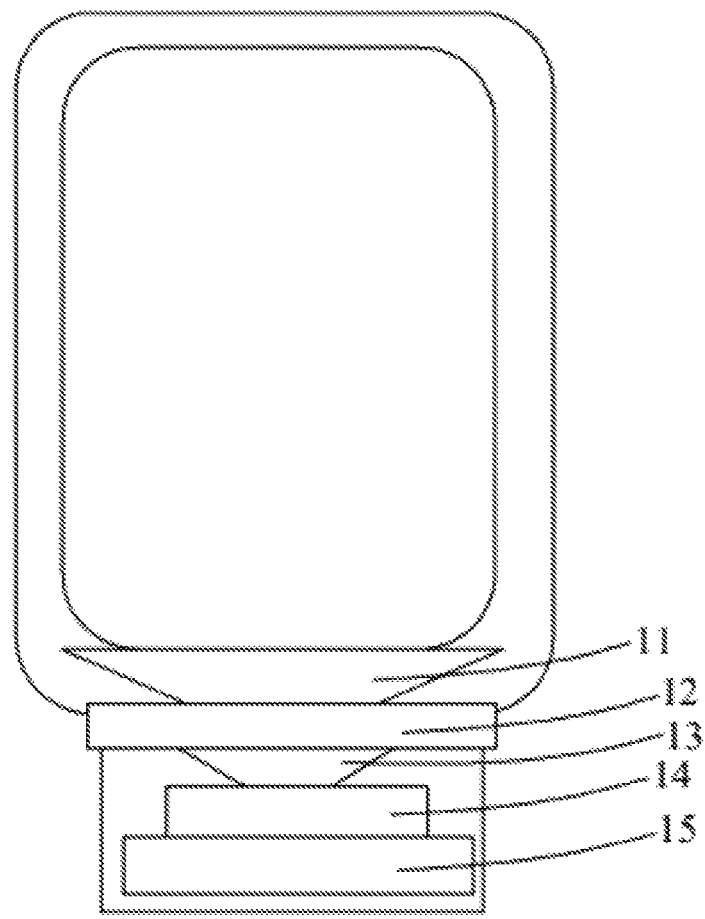
Figure 2:
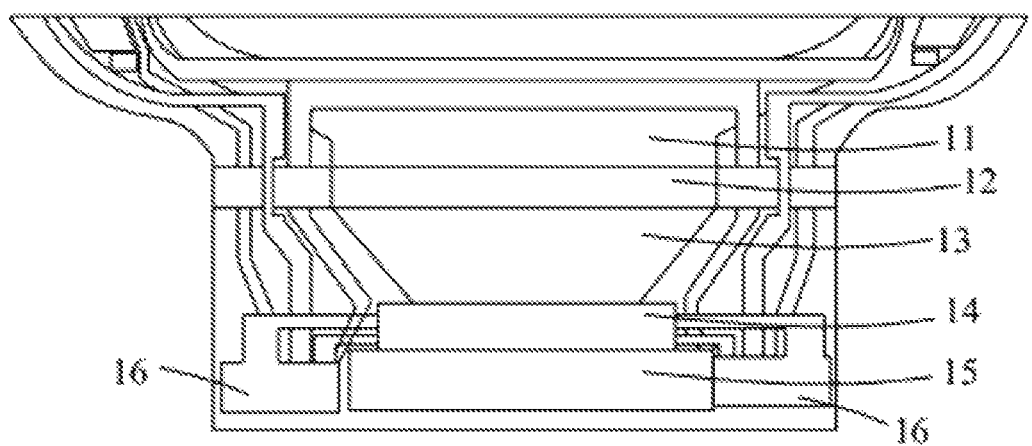
Figure 3:
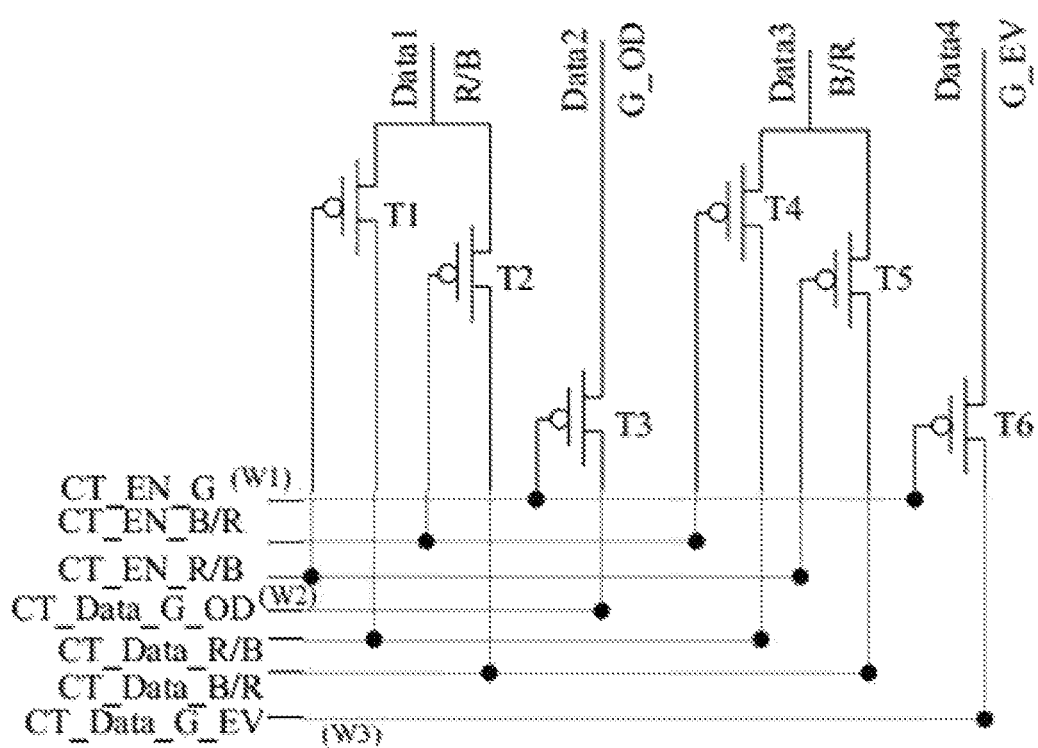

FIG. 3 is a schematic diagram of a circuit design of a display panel test circuit according to the present invention. The present invention mainly discusses a green data signal (G data). The display panel test circuit includes a plurality of metal-oxide-semiconductor field-effect transistors (MOSFETs) T3, T6; a first signal line W1 electrically connected to gates of the MOSFETs T3, T6; a second signal line W2 electrically connected to sources of a part of the MOSFETs; and a third signal line W3 electrically connected to sources of other part of the MOSFETs; wherein sources of any two adjacent MOSFETs of the plurality of MOSFETs are electrically connected to the second signal line W2 and the third signal line W3, respectively. The first signal line W1 is a driving signal line, and the second signal line W2 and the third signal line W3 are data signal lines. The driving signal line is a green driving signal line, and the data signal lines are green data signal lines. The MOSFETs are positive channel MOSFETs.

In order to clearly describe the test circuit of the present invention, FIG. 3 depicts only two MOSFETs T3, T6 corresponding to the green data signal; however, in a real circumstance there are still other MOSFETs corresponding to the green data signal that are located in the same row. The present invention optimizes a signal line of the green data signal by modifying one signal line originally electrically connected to the MOSFETs T3, T6 into the second signal line W2 and the third signal line W3, distinguishing MOSFETs (T3, T6, etc.) corresponding to the green data signal by their order into odd MOSFETs (T3, etc.) and even MOSFETs (T6, etc.), and electrically connecting the second signal line W2 to sources of the odd MOSFETs (T3, etc.), while electrically connecting the third signal line W3 to sources of the even MOSFETs (T6, etc.), to form a circuit design in which the second signal line W2 and the third signal line W3 drive the odd MOSFETs (T3, etc.) and the even MOSFETs (T6, etc.), respectively. That is, sources of any two adjacent MOSFETs corresponding to the green data signal are electrically connected to the second signal line W2 and the third signal line W3, respectively. When the odd MOSFETs (T3, etc.) or the even MOSFETs (T6, etc.) are lit, if a short circuit problem of two adjacent MOSFETs corresponding to the green data signal occurs, the situation will be displayed on the screen of the lighting test in the form of two dark lines, which substantially prevents the possibility of a data signal short circuit not being detected during the phase of lighting test and increases module process yields.

Figure 4:
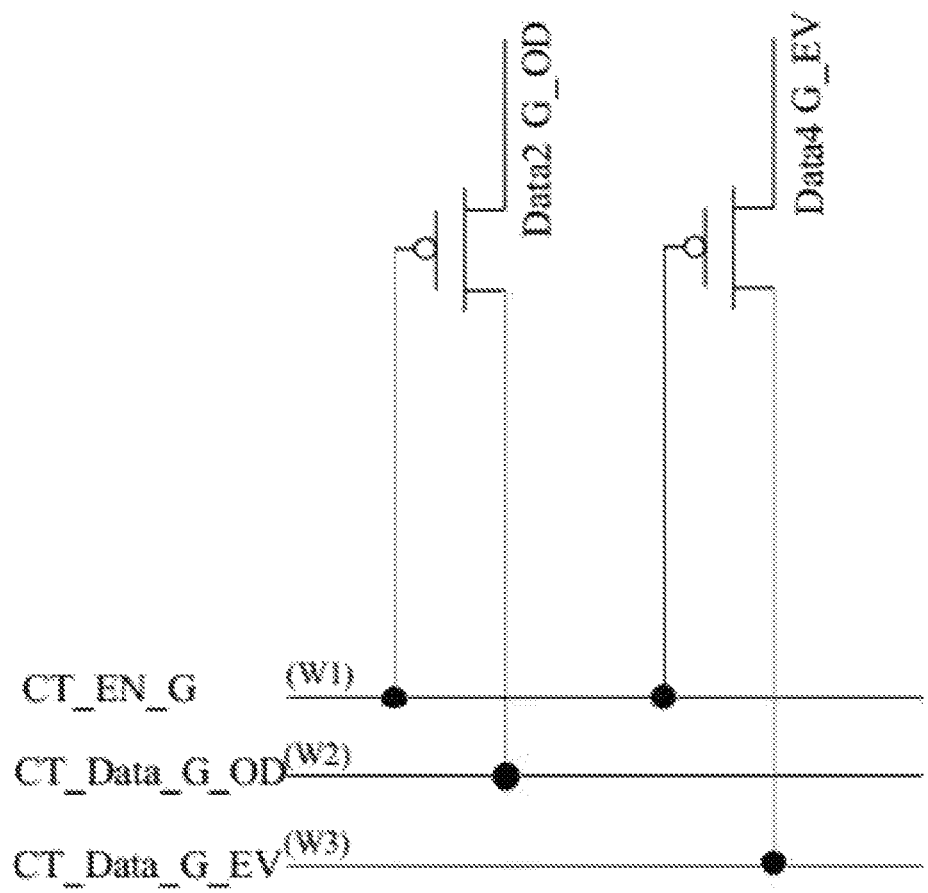

FIG. 4 is a schematic diagram of a green data signal driving part in the display panel test circuit according to the present invention. When the second signal line W2 is at a low voltage level, the third signal line W3 is at a high voltage level, and when the third signal line W3 is at the low voltage level, the second signal line W2 is at the high voltage level. The first signal line W1 controls whether or not to input data signal and is constantly in an on state. The second signal line W2 controls lighting state of pixels corresponding to the odd MOSFETs, and the third signal line W3 controls lighting state of pixels corresponding to the even MOSFETs. When controlling pixels corresponding to the odd MOSFETs to light, the second signal line W2 inputs 3V, the third signal line W3 inputs 6V, and if a short circuit problem of two adjacent MOSFETs corresponding to the green data signal occurs, voltage of the two green data signals will become about 4.5V, and two dark lines will be displayed on the screen of the lighting test; thereby, it can be instantly determined whether there is a data signal short circuit situation or not. When controlling pixels corresponding to the even MOSFETs to light, the third signal line W3 inputs 3V, the second signal line W2 inputs 6V, and if a short circuit problem of two adjacent MOSFETs corresponding to the green data signal occurs, voltage of the two green data signals will become about 4.5V, and two dark lines will be displayed on the screen of the lighting test; thereby, it can be instantly determined whether there is a data signal short circuit situation or not.

FIG. 5 a schematic diagram of a test pad pin of the display panel test circuit according to an embodiment of the present invention. The test pad pin is electrically connected to the display panel test circuit according to the present invention and includes an odd green data signal pin 511 electrically connected to the second signal line W2. In one embodiment, the test pad pin further includes a dummy pin, wherein the dummy pin is an even green data signal pin 610 electrically connected to the third signal line W3.

The test pad pin includes a plurality of direct current signal pins 110, 120, and 130, a plurality of test pins 210 and 220, a plurality of gate on array (GOA) signal pins 310 and 320, a driving signal pin 400, a data signal pin 500, and the even green data signal pin 610 electrically connected to the third signal line W3, wherein the data signal pin 500 includes the odd green data signal pin 511 electrically connected to the second signal line W2, a blue data signal pin 520, and a red data signal pin 530. The test pad pin according to the present embodiment changes the original green data signal pin into an odd green data signal pin 511, and changes the dummy pin into an even green data signal pin 610. Therefore, the manufacturing process remains unchanged, and it needs only adding wiring of the dummy pin connected to the display panel test circuit according to the present invention such that separate control of the odd and even MOSFETs can be realized.

FIG. 6 a schematic diagram of a test pad pin of the display panel test circuit according to another embodiment of the present invention. The test pad pin further includes an even green data signal pin 700 located between the direct current signal pin 120 and the test pin 210 and electrically connected to the third signal line W3. In another embodiment, the test pad pin further includes an even green data signal pin (not shown) located on one side of the dummy pin 600 and electrically connected to the third signal line W3.

The difference between the test pad pin according to another embodiment of the present invention in FIG. 6 and that in FIG. 5 is that the even green data signal pin 700 located between the test pin 210 and the direct current signal pin 120 and electrically connected to the third signal line W3 is added. In another embodiment, an even green data signal pin electrically connected to the third signal line W3 is added on one side of the dummy pin 600 (not shown) to realize separate control of the odd and even MOSFETs.

Beneficial effects: the display panel test circuit according to the present invention can detect a short circuit problem of the green data signal during the phase of lighting test, and thereby monitor and increase yields of AMOLED display panels.

Although the present invention has been explained in relation to its preferred embodiment, it does not intend to limit the present invention. It is obvious to those skilled in the art having regard to this present invention that other modifications of the exemplary embodiments beyond these embodiments specifically described here may be made without departing from the spirit of the invention. Accordingly, such modifications are considered within the scope of the invention as limited solely by the appended claims.

What is claimed is:

1. A test pad pin of a display panel test circuit electrically connected to a display panel test circuit, wherein the display panel test circuit comprises:
   a plurality of metal-oxide-semiconductor field-effect transistors (MOSFETs);
   a first signal line electrically connected to gates of the MOSFETs;
   a second signal line electrically connected to sources of a part of the MOSFETs; and
   a third signal line electrically connected to sources of other part of the MOSFETs;
   wherein sources of any two adjacent MOSFETs of the plurality of MOSFETs are electrically connected to the second signal line and the third signal line, respectively;
   wherein the test pad pin comprises:
   an odd green data signal pin electrically connected to the second signal line; and
   a dummy pin, wherein the dummy pin is an even green data signal pin electrically connected to the third signal line.

2. The test pad pin as claimed in claim 1, wherein the first signal line is a driving signal line, and the second signal line and the third signal line are data signal lines.

3. The test pad pin as claimed in claim 1, wherein the display panel is an active-matrix organic light-emitting diode (AMOLED) display panel.

4. The test pad pin as claimed in claim 1, wherein the MOSFETs are positive channel MOSFETs.

5. The test pad pin as claimed in claim 2, wherein the driving signal line is a green driving signal line, and the data signal lines are green data signal lines.

6. The test pad pin as claimed in claim 2, wherein when the second signal line is at a low voltage level, the third signal line is at a high voltage level, and when the third signal line is at the low voltage level, the second signal line is at the high voltage level.

7. A test pad pin of a display panel test circuit electrically connected to a display panel test circuit, wherein the display panel test circuit comprises:
   a plurality of metal-oxide-semiconductor field-effect transistors (MOSFETs);
   a first signal line electrically connected to gates of the MOSFETs;
   a second signal line electrically connected to sources of a part of the MOSFETs; and
   a third signal line electrically connected to sources of other part of the MOSFETs;
   wherein sources of any two adjacent MOSFETs of the plurality of MOSFETs are electrically connected to the second signal line and the third signal line, respectively, and when the second signal line is at a low voltage level, the third signal line is at a high voltage level, and when the third signal line is at the low voltage level, the second signal line is at the high voltage level;
   wherein the test pad pin comprises:
   an odd green data signal pin electrically connected to the second signal line; and
   a dummy pin, wherein the dummy pin is an even green data signal pin electrically connected to the third signal line.

8. The test pad pin as claimed in claim 7, wherein the first signal line is a driving signal line, and the second signal line and the third signal line are data signal lines.

9. The test pad pin as claimed in claim 7, wherein the display panel is an active-matrix organic light-emitting diode (AMOLED) display panel.

10. The test pad pin as claimed in claim 7, wherein the MOSFETs are positive channel MOSFETs.

11. The test pad pin as claimed in claim 8, wherein the driving signal line is a green driving signal line, and the data signal lines are green data signal lines.

* * * * *